United States Patent [19]

Kitamura

[11] Patent Number: 5,637,274

[45] Date of Patent: Jun. 10, 1997

[54] PALLADIUM ALLOY THIN WIRE FOR WIRE BONDING SEMICONDUCTOR ELEMENTS

[75] Inventor: Osamu Kitamura, Kawasaki, Japan

[73] Assignee: Nippon Steel Corporation, Tokyo, Japan

[21] Appl. No.: 507,432

[22] PCT Filed: Mar. 18, 1994

[86] PCT No.: PCT/JP94/00449

§ 371 Date: Sep. 8, 1995

§ 102(e) Date: Sep. 8, 1995

[87] PCT Pub. No.: WO94/21833

PCT Pub. Date: Sep. 29, 1994

[30] Foreign Application Priority Data

Mar. 19, 1993 [JP] Japan ..................................... 5-060781

[51] Int. Cl.$^6$ ....................................... C22C 5/04
[52] U.S. Cl. .................... 420/463; 428/606; 438/106; 228/904
[58] Field of Search .................. 437/209 WB; 420/463, 420/464, 465; 148/405, 430; 428/606; C22C 5/04

[56] References Cited

U.S. PATENT DOCUMENTS

| 5,298,219 | 3/1994 | Toyofuku et al. ................. 420/510 |
| 5,431,875 | 7/1995 | Cameron et al. ................. 420/463 |

FOREIGN PATENT DOCUMENTS

| 59-177339 | 10/1984 | Japan . | |
| 61-186437 | 8/1986 | Japan ................. | 420/464 |
| 01215938 | 8/1989 | Japan ................. | C22C 0/40 |
| 5-160187 | 6/1993 | Japan . | |
| 06271959 | 9/1994 | Japan ................. | C22C 0/40 |
| 59-201454 | 11/1994 | Japan . | |

*Primary Examiner*—David A. Simmons
*Assistant Examiner*—Margery S. Phipps
*Attorney, Agent, or Firm*—Kenyon & Kenyon

[57] ABSTRACT

The present invention provides a Pd alloy thin wire for wire bonding semiconductor elements comprising Ca, Al, Cr and Si each in an amount of up to 0.0003% by weight, from 0.001 to 0.01% by weight of In, optionally one or both of Au and Ag each having a purity of at least 99.99% in respective amounts of 0.001 to 2.0% by weight and 0.001 to 5.0% by weight, and the balance Pd having a purity of at least 99.99% by weight and unavoidable impurities. The Pd alloy thin wire exhibits an excellent loop shape compared with that of an Au alloy thin wire, ensures bonding reliability, and can replace an Au bonding wire.

2 Claims, No Drawings

PALLADIUM ALLOY THIN WIRE FOR WIRE BONDING SEMICONDUCTOR ELEMENTS

FIELD OF THE INVENTION

The present invention relates to a Pd alloy thin wire suited to be used in the wire bonding practiced during the production of semiconductor devices.

BACKGROUND OF THE INVENTION

An Al alloy thin wire, a very pure Cu alloy thin wire or an Au alloy thin wire have heretofore been used as materials for connecting electrodes on semiconductor elements to external leads. The Al alloy thin wire is bonded by a method comprising heating a lead frame in which semiconductor elements are arranged to about 150° to 300° C., and using ultrasonic press bonding. Since Al is extremely oxidizable, ball bonding is generally not practiced. The very pure Cu alloy thin wire or Au alloy thin wire are generally bonded by the following procedures: the tip portion of the thin wire is heated and melted with an electric torch to form a complete sphere through surface tension; the ball portion is press bonded to the electrode on a semiconductor element which is heated to 150° to 300° C.; the thin wire on the lead side is further bonded to the lead, which has been plated with Ag or Pd, by ultrasonic press bonding. However, there arise problems as described below in the case of the highly pure Cu alloy thin wire. Cu reacts with the oxygen in the air during ball formation, and the ball surface is oxidized. In addition, the oxygen content of the ball portion becomes high, and consequently the ball shape becomes unstable. Moreover, since the hardness of the ball increases with an increase in oxygen, damage is caused to the part of Si chip under the electrode at the time of wire bonding. Accordingly, blowing inert gas is necessary for preventing the oxidation. As a result, Au has been mainly used for an alloy thin wire which is then capable of forming a stabilized complete sphere ball in air as a connecting material and which has a low electric resistance and a good thermal conductivity.

As the result of the development of fine processing techniques for semiconductor elements, such as LSIs, the density thereof has increased. Since the amount of Au alloy thin wires used in the semiconductor devices has increased, the supply of a new wire bonding material which is prepared at low cost and is excellent in reliability is in demand.

A material for wire bonding which is to replace the Au alloy thin wire is required to satisfy the following conditions: the material cost is less than Au, a ball can be stably formed, an appropriate loop shape can be obtained, the strength of the bonded portion and the reliability of the bonded portion subsequent to resin sealing are at least equivalent to those of the Au alloy thin wire, and no electromigration takes place.

Pd may be used as a metal material satisfying the conditions mentioned above. Japanese Unexamined Patent Publication (Kokai) Nos 59-177339 and 59-201454 have proposed to use Pd as a material for wire bonding. Japanese Unexamined Patent Publication (Kokai) No. 59-177339 has proposed a bonding wire comprising one or more rare earth elements in an amount of 0.0005 to 2% by weight and optionally one or more of Ge, Bc and Ca in an amount of 0.5%. Japanese Unexamined Patent Publication (Kokai) No. 59-201454 has disclosed Pd defined to have a purity of at least 99.995%, contents of Pt and Fe each less than 15 ppm and a Vickers hardness of less than 60 at the ball portion. As the result of examining the literature, including the patent publication mentioned above, it has become evident that a Pd alloy thin wire has disadvantages as described below. Even Pd having a purity of at least 99.995% exhibits a low loop shape compared with a Au alloy thin wire. Pd containing rare earth elements exhibits a further lower loop shape, and the edge of the semiconductor element may be contacted by the Pd thin wire during bonding. Since the ball becomes hard, the semiconductor element then suffers chip damage immediately under the electrode when the semiconductor element has no passivation film having a sufficient thickness under the electrode and the reliability of the semiconductor device may sometimes be impaired. Furthermore, it has become evident that when the Pd thin wire is ultrasonically press bonded to an inner lead of the lead frame at the time of second bonding, the wire may sometimes be insufficiently bonded.

DISCLOSURE OF THE INVENTION

The present inventors have purified palladium by various procedures using commercial, easily-available palladium, which palladium is defined to have a purity of at least 99.95% by weight, as a starting material and have elucidated the relationship between the contents of the impurity elements and the loop shape. As a result, they can provide a Pd alloy thin wire for ball bonding which exhibits a loop height equivalent to or greater than that of an Au alloy thin wire and which has the effect of inhibiting wire flow after resin sealing by controlling the contents of Ca, Al, Cr and Si in the Pd to respective predetermined amounts and allowing the Pd to contain In.

Furthermore, the present inventors have discovered that addition of at least one element selected from the group consisting of Au and Ag to the alloy has the effect of improving the bonding strength of the wire during a second bonding.

That is, the present invention provides a Pd alloy thin wire exhibiting a loop height equal to or higher than that of an Au alloy thin wire and suppressing a wire flow after resin sealing, which wire comprises Pd having a purity of 99.99% by weight, in which wire the respective contents of impurities such as Ca, Al, Cr and Si are each restricted to up to 0.0003% by weight and which wire contains from 0.001 to 0.01% by weight of In. Moreover, the bonding strength of a second bonding of the Pd alloy thin wire is further improved by allowing the Pd alloy to contain Au and/or Ag each having a purity of 99.99% by weight in an amount of 0.001 to 2.0% by weight and in an amount of 0.001 to 5.0% by weight, respectively.

BEST MODE OF OPERATION OF THE PRESENT INVENTION

The best mode of operation of the present invention will be explained.

Among impurities of Pd having a purity of 99.95%, each of the contents of Ca, Al, Cr, Si, Fe and Pt is usually from 0.01 to 0.001% by weight, and the total contents thereof are approximately from 0.02 to 0.009% by weight.

Noble metal elements Au, Pt and Pd each are generally known to increase their recrystallization temperature when they each contain trace amounts of Ca, Al, Cr and Si. The respective contents of Ca, Al, Cr and Si in Pd have been changed using Pd having a purity of 99.999%, and thin wires for wire bonding have been prepared. As the result of evaluating the loop shape of the thin wires, only those of the Pd thin wires each containing any of the above-mentioned elements in an amount of up to 0.0003% has exhibited a loop shape equivalent to that of the Au bonding wire. On the other hand, even when each of the contents of Fe and Pt in Pd has exceeded 0.0015% by weight, the Pd thin wire has been made to exhibit a loop shape equivalent to that of the Au bonding wire by making each of the respective contents of Ca, Al, Cr and Si be up to 0.0003% by weight.

Furthermore, when In is added to the Pd alloy and a ball is formed by an electric arc, In widens the recrystallization region of the Pd thin wire compared with the Pd thin wire containing no added In even with the same heat input. The loop height of the bonding wire of the Pd alloy thin wire thus obtained can, therefore, be made even higher than that of the Au alloy thin wire.

The effects of widening the recrystallization region becomes insufficient when the content of In is less than 0.001% by weight. On the other hand, a complete sphere becomes difficult to form during ball formation in air when the content exceeds 0.01% by weight. Accordingly, the content of In is defined to be from 0.001 to 0.01% by weight.

Furthermore, since In improves the Young's modulus of the Pd thin wire and reduces the wire deformation caused by a resin flow during resin sealing, In suppresses the wire flow after resin sealing. Although the effects increase approximately in proportion to the In content, a complete sphere becomes difficult to form in air as described above when the In content exceeds 0.01%. Accordingly, the content is defined to be the upper limit. The effects cannot be obtained when the content becomes less than 0.001%.

Furthermore, the bonding strength sometimes becomes insufficient during second bonding. As the result of carrying out investigation, the cause has been elucidated as described below. The surface of the inner lead is usually plated with Ag or Pd. When mutual diffusion-phase formation between the plating phase and the Pd thin wire is insufficient at the time of ultrasonic press bonding, mechanically press bonded portions are peeled to cause insufficient bonding strength. In the present invention, the problem has been solved by allowing Pd to contain Au and/or Ag, and thus promoting alloy formation of Pd and the plating metals at the inner lead portion. The alloying accelerating effects become insufficient when the Au content is less than 0.001% by weight. When the Au content exceeds 2.0% by weight, the hardness of the Pd thin wire increases, and the wire deformation increases during wire bonding. As a result, contact between wires takes place, and the reliability of the semiconductor device thus obtained is lowered. Accordingly, the Au content is defined to be from 0.001 to 2.0% by weight. Similarly, when the Ag content is less than 0.001% by weight, the effects become insufficient. When the Ag content exceeds 5.0% by weight, the hardness of the Pd thin wire increases, and the wire deformation during wire bonding increases. As a result, contact between wires takes place, and the reliability of the semiconductor device thus obtained is lowered. Moreover, a complete sphere is difficult to form during ball formation. Accordingly, the Ag content is defined to be from 0.001 to 5.0% by weight. When both metals are added, the effects obtained by single addition of any of both metals are not impaired. However, the most effective content ranges are as follows: an Au content of 0.002 to 0.5% by weight, and an Ag content of 0.005 to 1.0% by weight. In addition, the purity of Au and that of Ag have been defined for the following reasons: unavoidable impurities contained in these metals increase with the addition amounts thereof, and the loop height may become low. Particularly when the addition amounts exceed 1% by weight, the definition of the purity becomes effective.

EXAMPLES

Procedures as described below were carried out in a clean room having a cleanliness of 5,000/feet$^3$. A refractory crucible of high purity in which commercially available Pd having a purity of 99.95% was placed was charged in a very air-tight heating furnace. Pd was heated at 1,600° to 1,650° C. for about 30 minutes to 1 hour to be melted. At the time of heating Pd, a gas mixture containing water vapor obtained by introducing hydrogen or an inert gas into pure water or an aqueous saturated chloride solution held at a predetermined temperature was introduced into the heating furnace so that the oxygen partial pressure therein becomes from $10^{-2}$ to $10^{-3}$ at 1,600° C. At the time of introducing the gas mixture containing water vapor, the tubing was heated so that water vapor did not condense. Consequently, oxygen was dissolved in molten Pd, and it oxidized oxidizable elements therein such as Ca, Al, Cr and Si. The oxides thus formed were separated as an oxide phase on molten Pd. The furnace temperature was subsequently lowered, and molten Pd was solidified. Aqua regia or nitric acid was then poured on the surface of Pd, and ultrasonic waves were applied to effect pickling. The oxide phase of the surface layer was thus completely removed. The resultant Pd was placed again in the heating furnace, and melted at 1,600° to 1,650° C. for about 30 minutes to 1 hour in an inert gas atmosphere containing from 3 to 5% of hydrogen, whereby oxygen in Pd was removed. The furnace space was then evacuated to have an atmosphere pressure of $10^{-4}$ to $10^{-5}$ torr, and the hydrogen in the Pd was removed. The furnace temperature was lowered, and the Pd was solidified. The furnace temperature was further cooled to room temperature, and the Pd (ingot) was taken out of the furnace. The melting time can be further shortened when a furnace having significant stirring effects such as a high frequency induction furnace is used. Moreover, there is also another method wherein the atmosphere in the furnace is evacuated once after oxidizing and removing Ca, Al, Cr, Si, etc. in Pd, and hydrogen reduction is carried out. The oxygen partial pressure within the furnace atmosphere is required to be approximately at least $10^{-6}$ in the method because oxidized iron may be reduced again when the oxygen partial pressure becomes up to the value mentioned above. Table 1 shows examples of the contents of Ca, Al, Cr and Si of Pd ingots thus obtained. It is seen from the results that the contents of elements to be removed among impurities in the Pd ingots were each up to 0.0003% by weight.

In addition, purification of Pd by zone melting cannot give Pd containing Ca, Al, Cr and Si each in an amount of up to 0.0003%. The proportion of a portion having good quality in Pd thus obtained is low, and, therefore, industrially carrying out zone melting is disadvantageous with regard to the processing cost.

Conventional wet refining may also be used as another method for separating Ca, Al, Cr and Si in Pd. However, the method cannot be concluded to be useful in view of the cost and the environmental problems, for example, the processing time, an increase in the industrial waste, and the like.

Next, In and other pure metals, or base alloys were added to an ingot obtained by procedures as described above predetermined amounts, and vacuum melting was carried out provided that the metal mixture was melted in an inert gas atmosphere at least at 1,000° C. when Ag was contained. The addition yield of Ag could thus be improved. The molten mixture was sufficiently stirred so that the components thereof were uniformly mixed, and cast to give an ingot having a predetermined size. Subjecting the ingot thus obtained to zone melting at a transfer rate of at least 15 mm/min is particularly effective in preventing segregation therewithin.

The ingot thus obtained and having a cross section of 20 ×20 mm or 30×30 mm was rolled using a grooved roll to finally form a bar from 5 to 10 mm in diameter. The bar was further subjected to single head wire drawing to reduce the cross section. In the present invention, to prevent wire breaking during drawing caused by work hardening and to satisfy the condition that the thinned (drawn) and finally tempered wire (that is, an elongation of 4 to 6% is imparted thereto) had a large rupture strength compared with a Au alloy thin wire, the wire was subjected to intermediate annealing when the wire had a diameter from 32 to 100 times as much as the final desired diameter (corresponding to a reduction of area of 99.9 to 99.99%).

The intermediate annealing is desirably carried out under the following recrystallization conditions: the wire is passed through the furnace at a rate of 50 m/min at a temperature of 700° to 800° C. in an non-oxidizing atmosphere produced by allowing an inert gas to flow therein to form crystals having an average grain size of 5 to 15 µm. The furnace temperature must be changed to a lower temperature when the wire speed is lowered, and it must be changed to a higher temperature when the wire speed is increased. However, when the furnace temperature is made high, wire breaking may take place due to the weight of the wire itself when the furnace temperature is raised. The wire was drawn until it had a final wire diameter. The extremely thin wire thus obtained was tempered to have an elongation of 4 to 6% by passing the wire through a continuous annealing furnace in an inert atmosphere held at a predetermined temperature.

The Pd thin wire thus obtained and having a diameter of 25 µm was ball bonded at a span of 2.5 mm under the same conditions using a high speed automated bonder, and the highest height of the loop shape was measured using an optical microscope. In addition, a test of preventing a Pd ball from being oxidized was also carried out by blowing an inert gas during ball bonding. However, since there was practically no difference between such ball formation and Pd ball formation in air, further experiments were all carried out under the condition that the ball was formed in air. As to the loop shape, measurements of the highest height of loops were made on 50 pieces of the bonded wire while the upper surface of the semiconductor element was used as a reference surface using an optical microscope, and the average value and the distribution were obtained. As to the wire deformation subsequent to bonding, the displacement from a line connecting a first bonding position and a second bonding position was measured using a stereomicroscope, and the average value and the dispersion were obtained. The bonding strength of a second bonding was obtained as described below. A bonding wire was hooked near the bonded portion, vertically pulled, and the ruptured position of the wire was examined. Since the breaking load decreases by 10 to 20% when the ruptured position is located at the second bonding portion, the measurement can be practiced. In the present examples, the ratio of a number of bonding wires which had each a ruptured position at the second bonding position was examined on 100 bonding wires, and the bonding strength was evaluated by the rate of occurrence. Moreover, the damage formed at a portion of the semiconductor element under the electrode during first bonding was evaluated as described below. The Pd at the electrode of the semiconductor element was peeled off after bonding, and the Al electrode was dissolved with aqueous ammonia. One hundred electrode portions of semiconductor elements were observed with an optical microscope to check the presence of chip damage. The number of the portions which suffered damage was examined. The results thus obtained are shown in Tables 1 and 2.

Sealing with resins of the same lot was carried out after resin sealing, and the flow of Pd thin wires after sealing with the resins was measured using a soft X-ray transmission apparatus. Tables 1 and 2 show the measured results including a difference between the wire flow prior to resin sealing and that subsequent to resin sealing, in the same manner as in the above-mentioned wire deformation.

In addition, Table 2 also shows the results of Au bonding wire.

The results may be summarized as described below. A bonding wire in the range of the present invention exhibited a high loop height compared with an Au alloy material and a comparative material. In addition, bonding wires No. 17 and No. 19 among the comparative bonding wires and an Au bonding wire No. 25 each exhibited a high loop height compared with a bonding wire No. 23 of the present invention. However, No. 17 and No. 25 each exhibited a large wire flow, and No. 19 exhibited a deteriorated peelability. Such wire flows (amounts of wire deformation) including the amounts of wire flows after resin sealing of bonding wires in the scope of the present invention were small compared with the comparative bonding wires and the Au alloy bonding wires. The flow amount of any of the bonding wires of the present invention after resin sealing was significantly smaller than that of the comparative bonding wires and the Au alloy bonding wires. The effects of adding In were thus evident.

Moreover, when the bonding wires of the present invention are compared with the comparative bonding wires with regard to the bonding strength (bond peelability) at the second bonding portions, it can be concluded that the former exhibited a small number of ruptured bonding wires at the second bonding portions compared with the latter, and that the former were, therefore, excellent in soundness. Furthermore, the bonding wires in the scope of the present invention produced no chip damage, whereas most of the comparative bonding wires suffered chip damage.

TABLE 1

| | | | | Results of chemical analysis (wt. %) | | | | | |
|---|---|---|---|---|---|---|---|---|---|---|
| Sample No. | | Ca | Al | Cr | Si | Fe | Pt | Au | Ag | In |
| Invention | 1 | 0.0003 | 0.0003 | 0.0002 | 0.0003 | 0.0016 | 0.0020 | — | 0.0050 | 0.05 |
| | 2 | 0.0002 | 0.0003 | 0.0001 | 0.0001 | 0.0002 | 0.0007 | — | 4.97 | 0.011 |
| | 3 | 0.0001 | 0.0001 | 0.0001 | Tr | 0.0001 | 0.0013 | 1.05 | 3.50 | 0.040 |
| | 4 | 0.0003 | Tr | Tr | Tr | 0.0004 | 0.0016 | — | — | 0.0011 |
| | 5 | Tr | 0.0003 | Tr | 0.0001 | 0.0003 | 0.0016 | — | — | 0.0095 |
| | 6 | 0.0003 | 0.0001 | 0.0001 | 0.0003 | 0.0004 | 0.0012 | 0.0050 | — | 0.0011 |
| | 7 | 0.0003 | 0.0002 | 0.0003 | 0.0002 | 0.0005 | 0.0005 | — | 0.005 | 0.0010 |
| | 8 | 0.0003 | 0.0002 | Tr | Tr | 0.0016 | 0.0005 | 1.80 | 2.50 | 0.0065 |
| | 9 | 0.0002 | 0.0001 | 0.0002 | 0.0002 | 0.0002 | 0.0010 | 0.005 | 0.005 | 0.0020 |
| | 10 | 0.0002 | Tr | Tr | Tr | 0.0001 | 0.0005 | 1.95 | 4.90 | 0.0090 |

Note:
Tr in the table signifies that the amount was up to 0.0001% by weight, i.e., lower limit of the analysis.

| | | Loop height | | Wire flow | | Number of second peeling suffered | Number of chips having | Wire flow after |
|---|---|---|---|---|---|---|---|---|
| Sample No. | | (μm) | σ | (μm) | σ | (pieces) | damage sealing | resin |
| Invention | 1 | 232.4 | 10.1 | 7.6 | 7.4 | 0 | 0* | 9.2(+1.2) |
| | 2 | 189.4 | 7.8 | 8.6 | 9.4 | 0 | 0 | 10.1(+1.5) |
| | 3 | 189.6 | 8.0 | 9.2 | 9.7 | 0 | 0 | 11.3(+2.1) |
| | 4 | 223.8 | 11.3 | 12.9 | 10.7 | 0 | 0 | 14.2(+1.3) |
| | 5 | 236.8 | 13.2 | 12.6 | 11.4 | 0 | 0 | 13.7(+1.1) |
| | 6 | 211.6 | 9.3 | 12.6 | 10.6 | 0 | 0 | 14.3(+1.7) |
| | 7 | 225.5 | 10.2 | 12.9 | 10.1 | 0 | 0 | 14.2(+1.3) |
| | 8 | 206.4 | 11.4 | 11.4 | 9.9 | 0 | 0 | 13.0(+1.6) |
| | 9 | 220.7 | 10.4 | 12.0 | 8.6 | 0 | 0 | 13.6(+1.6) |
| | 10 | 213.8 | 9.5 | 12.4 | 10.6 | 0 | 0 | 13.7(+1.3) |

Note:
*: An extraordinary ball was formed.

TABLE 2

| | | | | Results of chemical analysis (wt. %) | | | | | |
|---|---|---|---|---|---|---|---|---|---|---|
| Sample No. | | Ca | Al | Cr | Si | Fe | Pt | Au | Ag | In |
| C.E.* | 11 | 0.0015 | 0.0002 | 0.0005 | 0.0002 | 0.0012 | 0.0013 | — | — | — |
| | 12 | 0.0003 | 0.0006 | 0.0002 | 0.0002 | 0.0012 | 0.0013 | — | — | — |
| | 13 | 0.0017 | 0.0006 | 0.0005 | 0.0002 | 0.0012 | 0.0013 | — | — | — |
| | 14 | 0.009 | 0.0002 | 0.0002 | 0.0002 | 0.0003 | 0.0010 | — | — | — |
| | 15 | 0.0002 | 0.0001 | 0.0010 | 0.0002 | 0.0002 | 0.0009 | — | — | — |
| | 16 | 0.0002 | 0.0001 | 0.0004 | 0.0008 | 0.0002 | 0.0009 | — | — | — |
| | 17 | 0.0001 | 0.0001 | Tr | Tr | 0.0001 | 0.0002 | 0.004 | — | — |
| | 18 | 0.0002 | 0.0001 | 0.0002 | 0.0002 | 0.0002 | 0.0010 | 3.50 | — | — |
| | 19 | 0.0005 | Tr | Tr | Tr | 0.0001 | 0.0005 | — | 0.003 | — |
| | 20 | 0.0020 | 0.0006 | 0.0005 | 0.0002 | 0.0012 | 0.0013 | — | 6.53 | — |
| | 21 | 0.0015 | 0.0006 | 0.0005 | 0.0002 | 0.0012 | 0.0017 | — | — | 0.0005 |
| | 22 | 0.0008 | 0.0001 | 0.0002 | 0.0002 | 0.0002 | 0.0009 | La: 0.0050 | | |
| | 23 | 0.0010 | 0.0002 | 0.0004 | 0.0004 | 0.0003 | 0.0010 | Be: 0.0010 | | |

| | | Results of chemical analysis (wt. %) | | | | | | |
|---|---|---|---|---|---|---|---|---|
| Sample No. | | Ca | Be | La | Al | — | — — | Purity |
| Au alloy | 24 | 0.0004 | 0.0006 | — | — | — | — — | at least 99.99% |
| | 25 | — | 0.0010 | — | — | — | — — | at least 99.99% |
| | 26 | 0.0015 | — | 0.0010 | 0.005 | — | — — | at least 99.99% |

Note:
Tr in the table signifies that the amount was up to 0.0001% by weight, i.e., lower limit of the analysis.
*C.E. = Comparative Example

| | | Loop height | | Wire flow | | Number of second peeling suffered | Number of chips having | Wire flow after |
|---|---|---|---|---|---|---|---|---|
| Sample No. | | (μm) | σ | (μm) | σ | (pieces) | damage sealing | resin |
| C.E.* | 11 | 158.4 | 17.9 | 15.3 | 12.8 | 3 | 2 | 19.1(+3.8) |
| | 12 | 178.4 | 17.3 | 13.9 | 14.3 | 1 | 1 | 17.7(+3.8) |
| | 13 | 154.4 | 13.9 | 13.2 | 12.8 | 4 | 3 | 17.1(+3.9) |

TABLE 2-continued

| | | | | | | Number of second peeling suffered | Number of chips having | Wire flow after |
|---|---|---|---|---|---|---|---|---|
| | 14 | 144.3 | 17.4 | 18.3 | 15.7 | 2 | 2 | 22.5(+4.2) |
| | 15 | 179.4 | 17.1 | 16.7 | 14.2 | 3 | 0 | 20.4(+3.7) |
| | 16 | 173.4 | 17.2 | 12.5 | 9.8 | 1 | 0 | 15.7(+3.2) |
| | 17 | 196.9 | 19.3 | 18.5 | 13.2 | 1 | 0 | 22.9(+4.4) |
| | 18 | 174.7 | 13.6 | 9.6 | 10.6 | 2 | 3 | 12.8(+3.2) |
| | 19 | 203.8 | 9.9 | 11.7 | 8.9 | 1 | 0 | 16.2(+4.5) |
| | 20 | 148.4 | 8.9 | 13.8 | 11.5 | 2 | 2 | 17.7(+3.9) |
| | 21 | 168.4 | 13.9 | 16.3 | 13.7 | 1 | 1 | 19.4(+3.1) |
| | 22 | 155.7 | 18.4 | 11.6 | 12.4 | 1 | 2 | 16.1(+4.5) |
| | 23 | 178.7 | 20.1 | 18.2 | 16.2 | 0 | 1 | 21.8(+3.6) |

| | Sample No. | Loop height (μm) | σ | Wire flow (μm) | σ | Number of second peeling suffered (pieces) | Number of chips having damage sealing | Wire flow after resin |
|---|---|---|---|---|---|---|---|---|
| Au alloy | 24 | 172.7 | 13.3 | 13.7 | 10.7 | 0 | 0 | 18.4(+4.7) |
| | 25 | 210.3 | 10.9 | 20.6 | 17.5 | 0 | 0 | 24.9(+4.3) |
| | 26 | 155.3 | 9.9 | 15.2 | 13.8 | 0 | 0 | 19.8(+4.6) |

POSSIBILITY OF UTILIZATION IN THE INDUSTRY

As described above in detail, the present invention can stably provide a low cost bonding wire, to the industrial field, which exhibits an excellent loop shape compared with that of a Au bonding wire, and, therefore, the present invention is industrially extremely effective.

I claim:

1. A Pd alloy thin wire for wire bonding semiconductor elements consisting essentially of In in an amount of 0.001 to 0.01% by weight, Ca, Al, Cr and Si each in an amount of up to 0.0003% by weight, and the balance Pd having a purity of at least 99.99% and unavoidable impurities.

2. The Pd alloy thin wire according to claim 1, wherein the Pd alloy thin wire further consists essentially of at least one member selected from a group consisting of Au having a purity of at least 99.99% in an amount of 0.001 to 2.0% by weight and Ag having a purity of at least 99.99% in an amount of 0.001 to 5.0% by weight.

* * * * *